(12) United States Patent
Uzoh

(10) Patent No.: US 9,455,162 B2
(45) Date of Patent: Sep. 27, 2016

(54) LOW COST INTERPOSER AND METHOD OF FABRICATION

(71) Applicant: Invensas Corporation, San Jose, CA (US)

(72) Inventor: Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 536 days.

(21) Appl. No.: 13/830,279

(22) Filed: Mar. 14, 2013

(65) Prior Publication Data

US 2014/0263582 A1    Sep. 18, 2014

(51) Int. Cl.
*H01L 21/44* (2006.01)
*H01L 21/64* (2006.01)
*H01L 23/498* (2006.01)
*H01L 21/48* (2006.01)

(52) U.S. Cl.
CPC ............. *H01L 21/64* (2013.01); *H01L 21/486* (2013.01); *H01L 23/49827* (2013.01); *H01L 23/49861* (2013.01); *H01L 2924/0002* (2013.01); *H01L 2924/19107* (2013.01)

(58) Field of Classification Search
CPC ............. H01L 24/17; H01L 23/49861; H01L 23/49827; H01L 21/486; H01L 21/64; H01L 2924/0002; H01L 2924/1907
USPC ....................................................... 438/597
See application file for complete search history.

(56) References Cited

U.S. PATENT DOCUMENTS

| | | | |
|---|---|---|---|
| 6,690,186 B2 * | 2/2004 | Fjelstad | 324/756.03 |
| 7,273,812 B2 * | 9/2007 | Kim et al. | 438/670 |
| 7,382,142 B2 * | 6/2008 | Chong et al. | 324/750.25 |
| 7,688,095 B2 * | 3/2010 | Cordes et al. | 324/754.18 |
| 2011/0260338 A1 | 10/2011 | Lee et al. | |

FOREIGN PATENT DOCUMENTS

| | | |
|---|---|---|
| EP | 1093329 A2 | 4/2001 |
| EP | 1176641 A2 | 1/2002 |
| JP | 2009224448 A | 10/2009 |
| JP | 2011049606 A | 3/2011 |
| TW | 201201297 A | 1/2012 |

OTHER PUBLICATIONS

International Search Report and Written Opinion for Application No. PCT/US2014/027726 dated Jul. 9, 2014.

* cited by examiner

*Primary Examiner* — Tod T Van Roy
*Assistant Examiner* — Vu A Vu
(74) *Attorney, Agent, or Firm* — Lerner, David, Littenberg, Krumholz & Mentlik, LLP

(57) ABSTRACT

A method for making an interposer is provided. A conductive layer is formed by contacting a replicate such that a shape of a surface of the conductive layer conforms to a shape of the contacted portion of the replicate. The conductive layer is formed to have a base and a plurality of conductive posts projecting away from the base. Each conductive post is formed to have a post end opposite the base. A dielectric layer is formed to cover the base and to separate adjacent ones of the posts from each other. The posts are for forming vias. Conductive material is removed from the conductive layer to insulate at least one post from at least one other post.

20 Claims, 5 Drawing Sheets

LOW COST INTERPOSER AND METHOD OF FABRICATION

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron (μm) thick. The bond pads could include a single layer or multiple layers of metal. The size of the bond pads will vary with the device type but will typically measure tens to hundreds of microns on a side.

An interposer can be used to provide electrical connections between microelectronic elements such as one or more unpackaged or packaged semiconductor chips with one another, or between one or more unpackaged or packaged semiconductor chips and other components such as an integrated passives on chip ("IPOC") having passive circuit elements thereon, discrete passive devices, e.g., capacitors, resistors, or inductors or a combination of the same, without limitation. An interposer can couple such chip or plurality of chips with other structure such as a circuit panel.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in interposer structure and fabrication, further improvements can be made to enhance the processes for making interposers and the structures which can result from such processes.

SUMMARY OF THE INVENTION

In accordance with an aspect of the invention, a method for making an interposer is provided. In accordance with such an aspect, a conductive layer may be formed by contacting a replicate such that a shape of a surface of the conductive layer conforms to a shape of the contacted portion of the replicate. The conductive layer may have a base and may have a plurality of conductive posts projecting away from the base. Each of the conductive posts may have a post end opposite the base. A dielectric layer may be formed. The dielectric layer may cover the base. The dielectric layer may separate adjacent ones of the posts from each other. A portion of the conductive layer may be removed to insulate at least one post from at least one other post. A remaining portion of the conductive layer may form at least one via. In some arrangements, the posts may form vias.

In some aspects, a seed coating may be plated onto the replicate during the formation of the conductive layer. The plating of the seed coating may be performed by an electroless plating process.

In some aspects, one or both of a barrier layer and an electroless adhesion layer may be formed onto the replicate prior to the formation of the conductive layer.

In some aspects, a seed coating may be formed onto the replicate during the formation of the conductive layer. In some such aspects, a conductive material may formed on the seed coating. In some such aspects, the conductive material may be formed on the seed coating by an electrolytic plating process.

In some such aspects, the electrolytic plating may be performed at a rate in the range between 2 μm/min and 10 μm/min.

In some aspects, the dielectric layer may be one of a permanent resist coating, a mold, lamination, and a conformal coating.

In some aspects, the dielectric layer may be a conformal coating. In some such aspects, a heat conducting layer may be formed on the conformal coating. In some aspects, the heat conducting layer may be a mold matrix.

In some aspects, the post ends may be exposed for electrical connection therewith.

In some aspects, at least some of the portion of the dielectric layer covering the conductive layer may be planarized to form a flat surface of the dielectric layer. In some aspects the dielectric layer may be planarized to expose the post ends for electrical connection therewith. In some aspects, the dielectric layer may be planarized to remove unwanted materials.

In some aspects, the planarization of the dielectric layer may be performed by milling.

In some aspects, the dielectric layer may be formed to cover at least some of the plurality of conductive posts of the conductive layer. In some such aspects, portions of the dielectric layer may be thinned to remove unwanted materials. In some aspects, the dielectric layer may be thinned to expose the post ends of the at least some conductive posts.

In some aspects, a portion of the conductive posts may be removed to expose a void within the conductive posts. In some such aspects, the void may be filled to provide rigidity to the conductive post.

In some aspects, a conductive coating may be formed over at least a portion of the dielectric layer. In some such aspects, the conductive coating may be at least electrically interconnected to the post ends of at least some of the plurality of conductive posts.

In some aspects, the post ends of the one or more of the plurality of conductive posts may be at a top surface of the dielectric layer. In some such aspects, the conductive coating may be physically connected to the post ends.

In some aspects, the conductive coating may be etched to form etched sections of the conductive coating. In some such aspects, at least some of the etched sections of the conductive coating may not be electrically connected through the conductive coating and may not be electrically connected at all. In some aspects, at least one first joining element may be formed on the conductive coating. In some such aspects, the one or more first joining elements and the conductive coating may be electrically connected.

In some aspects, a redistribution structure may be formed on at least a portion of the dielectric layer. In some such aspects, the redistribution structure may have a predetermined pattern of traces and may have a redistribution dielectric structure at a top surface of the redistribution structure for interconnection with the conductive layer. In some such aspects, a conductive element optionally may pass through a void in the redistribution structure. In some such aspects, the conductive element may pass through the top surface of the redistribution structure.

In some aspects, a first conductive coating may be formed over at least a portion of the conductive posts of the conductive layer. In some such aspects, a second conductive coating may be formed onto the base of the conductive layer. In some such aspects, the first and second conductive coatings may be electrically coupled through the conductive layer.

In some such aspects, the first and second conductive coatings may be etched to form respective etched sections of the first and second conductive coatings. In some such aspects, at least some of the etched sections of the first conductive coating may not be electrically connected through the first conductive coating. In some such aspects, at least some of the etched sections of the second conductive coating may not be electrically connected through the second conductive coating. In some aspects, at least one first joining element may be formed on a corresponding one of the one or more etched sections of the first conductive coating that are not electrically connected to the rest of the first conductive coating. In some such aspects, such first joining elements may be being electrically connected with the first conductive coating. In some aspects, at least one second joining element may be formed on a corresponding one of the one or more etched sections of the second conductive coating not electrically connected to the rest of the second conductive coating. In some such aspects, such second joining elements may be being electrically connected with the second conductive coating. In some such aspects, one or more of the first joining elements may be connected to one or more of the second joining elements.

In some such aspects, at least a first microelectronic element may be attached to at least some of the first joining elements. In some such aspects, at least a second microelectronic element may be attached to at least some of the second joining elements. In some such aspects, at least the first microelectronic element and at least the second microelectronic element may be electrically connected through the conductive layer.

In some aspects, a plurality of the second joining elements may be formed and the one or more first joining elements may be electrically connected to less than all of the plurality of second joining elements. In some aspects, a plurality of the first joining elements may be formed and the one or second joining elements may be electrically connected to less than all of the plurality of first joining elements.

In some aspects, the base of the conductive layer may be severed during the step of removing a portion of the conductive layer. In some such aspects, the base may be severed to form insulated base ends of the conductive layer. In some aspects, the post ends of the conductive posts may be opposite the base ends. In some aspects, the base of the conductive layer may be severed by etching or other such patterning processes.

In some such aspects, first joining elements may be formed on the post ends of the conductive layer. In some such aspects, the first joining elements and the conductive layer may be electrically connected. In some such aspects, second joining elements may be formed on the base ends of the conductive layer. In some such aspects, the second joining elements and the conductive layer may be electrically connected. In some such aspects, at least a first microelectronic element may be attached to at least some of the first joining elements. In some such aspects at least a second microelectronic element may be attached to at least some of the second joining elements. In some such aspects, at least the one of the one or more first microelectronic elements and at least one of the one or more second microelectronic elements may be electrically connected through the conductive layer.

In some aspects, a first microelectronic element may be electrically coupled to a second microelectronic element through at least one insulated conductive post.

In some aspects, a support layer may be attached to the replicate. In some such aspects, the support layer may provide support to the replicate during at least one processing step.

In some such aspects, the support layer and replicate may be removed to expose the base of the conductive layer. In some such aspects, a first conductive coating may be formed over at least a portion of the conductive posts of the dielectric layer. In some such aspects, a second conductive coating may be formed onto the base of the conductive layer. In some such aspects, the first and second conductive coatings may be electrically connected through the conductive layer.

In some aspects, a second conductive layer may be formed by contacting the replicate such that a shape of a surface of the second conductive layer conforms to a shape of the contacted portion of the replicate. The second conductive layer may have a second base and may have a plurality of second conductive posts projecting away from the second base. Each of the second conductive posts may have a second post end opposite the second base. The second conductive layer may contact the replicate on a side of the replicate opposite the conductive layer. In some such aspects, the support layer may be removed from the replicate. In some such aspects, a first conductive coating may be formed over at least a portion of the conductive posts of the conductive layer. In some such aspects, a second conductive coating may be formed onto the base of the conductive layer. In some such aspects, the first and second conductive coatings may be electrically connected through the conductive layer.

In some aspects, first and second redistribution structures may be formed at oppositely-facing surfaces of the dielectric layer. In some such aspects, the first and second redistribution structures may have respective predetermined patterns of traces and redistribution dielectric layers at respective top and bottom sides of the redistribution structures. In some such aspects, the traces of the first and second redistribution layers may be electrically coupled to the conductive layer.

In some such aspects, the dielectric layer may be a conformal coating. In some such aspects, a heat conducting mold matrix may be formed on the conformal coating. In some such aspects, the heat conducting mold matrix may completely fill a space defined by the dielectric layer and the first and second redistribution layers.

In some aspects, first joining elements may be formed on the first redistribution structure. In some such aspects, the first joining elements and the conductive layer may be electrically connected. In some aspects, second joining elements may be formed on the second redistribution structure. In some such aspects, the second joining elements and the conductive layer may be electrically connected. In some such aspects, at least a first microelectronic element may be attached to at least some of the first joining elements. In some such aspects, at least a second microelectronic element may be attached to at least some of the second joining elements. In some such aspects, at least some of the one or more first microelectronic elements and at least some of the one or more second microelectronic elements may be electrically connected through the conductive layer.

In some aspects, at least one first joining element may be formed on the post ends of at least a respective one of the conductive posts. In some such aspects, the one or more first joining elements and respective ones of the conductive posts may be electrically connected.

In some aspects, one or both of at least one of the first and second joining elements may be a solder ball.

In some aspects, a first surface of at least a first microelectronic element may be attached to one or more of the first joining elements. In some such aspects, the first microelectronic element may be electrically connected to such first joining elements.

In some aspects, the any of the one or more first microelectronic elements may be a semiconductor chip.

In some aspects, a second surface of the one or more first microelectronic elements may be attached to a support element. In some such aspects, the base of the conductive layer may be severed during the removal of the conductive material. In some such aspects, the base may be severed to form insulated base ends of the conductive layer. In some such aspects, the post ends of the conductive posts may be opposite the base ends.

In some aspects, a seed coating may be formed prior to forming the conductive layer. In some such aspects, a mold dielectric layer may be formed onto the seed coating prior to forming the conductive layer. In some such aspects, the mold dielectric layer may include a plurality of holes through such layer. In some such aspects, a plurality of extensions within respective ones of the plurality of holes of the dielectric layer may be formed prior to forming the conductive layer. In some aspects, the mold dielectric layer may be removed from the seed coating to form a mold prior to forming the conductive layer. In some such aspects, the mold may include the extensions. In some such aspects, the replicate may be formed on the extensions of the mold prior to forming the conductive layer.

In some such aspects, the replicate may be removed from the mold. In some such aspects, the second surface of one or more of the first microelectronic elements may remain attached to the support element after the step of removing the replicate from the mold.

In some aspects, the second joining elements may be formed on at least some of the base ends. In some such aspects, at least a second microelectronic element may be attached to at least one of the second joining elements.

In some aspects, the conductive posts may be formed in sets of pairs such that there is a shorter distance between posts within a set of pairs than a distance between each of the posts within a set of pairs and any other posts adjacent to the posts within a set of pairs. In some other arrangements, other configurations of the conductive posts may also be formed.

In some aspects, a seed coating may be formed onto a substrate prior to the formation of the conductive layer. In some such aspects, a mold dielectric layer may be formed onto the seed coating. In some such aspects, the mold dielectric layer may include a plurality of holes within such a layer. In some such aspects, a plurality of extensions may be formed within respective ones of the plurality of holes of the mold dielectric layer prior to the step of forming the conductive layer. In some such aspects, the mold dielectric layer may be removed from the seed coating to form a mold prior to the step of forming the conductive layer. In some such aspects, the mold may include extensions. In some such aspects, the replicate may be formed on the extensions of the mold prior to the step of forming the conductive layer.

In some such aspects, the extensions may be conductive. In some such aspects, the conductive extensions may be at least electrically connected to the seed coating during formation of the conductive extensions.

In some aspects, the extensions may be filled to a level below an end of the mold dielectric layer opposite the seed coating.

In some aspects, any of the extensions may be polished to form a tapered side surface on the extensions. In some such aspects, the side surface of such extensions may extend from the seed coating. In some such aspects, the extensions may be polished by electropolishing. In some such aspects, after being polished, the side surfaces of the extensions may have a taper less than 5 degrees from vertical within planes extending radially from longitudinal axes through each of the respective extensions.

In some aspects, the replicate may conform to the mold such that the replicate has replicate extensions extending from a replicate base of the replicate.

In some aspects, the replicate may be removed from the mold.

In some aspects, a coating may be applied to the extensions for reducing the required force to perform the step of removing the replicate from the mold. In some such aspects, the coating may be a mold release agent.

In some aspects, the replicate may be formed by conformal coating. In some aspects, the replicate may be formed by sheet blow forming.

In accordance with an embodiment of the invention, a method for making an interposer is provided. In accordance with such an aspect, a replicate may be provided. A conductive layer may be formed by contacting a replicate such that a shape of a surface of the conductive layer conforms to a shape of the contacted portion of the replicate. The conductive layer may be formed to have a plurality of conductive posts. Each of the conductive posts may be formed to have top and bottom ends and side surfaces between the top and bottom ends. A dielectric layer may separate adjacent ones of the conductive posts from each other. The conductive posts may be used to form vias insulated from one another.

In some such aspects, a seed coating may be formed onto a substrate in providing the replicate. In some such aspects, a mold dielectric layer may be formed onto the seed coating in providing the replicate. In some such aspects, the mold dielectric layer may be formed to have a plurality of holes through such layer in providing the replicate. In some such aspects, a plurality of conductive extensions may be formed within respective ones of the plurality of holes of the first dielectric layer in providing the replicate. In some such aspects, the conductive extensions may be at least electrically connected to the seed coating in providing the replicate. In some such aspects, the mold dielectric layer may be removed from the seed coating to form a master in providing the replicate. In some such aspects, the master may include the conductive extensions in providing the replicate. In some such aspects the replicate may be formed on the conductive extensions of the master in providing the replicate.

In some such aspects, the replicate may be removed from the master.

In some aspects, the portion of the dielectric layer separating adjacent ones of the posts from one another may be planarized to form a flat surface of the dielectric layer. In some such aspects, a first layer of conductive coating may be formed over at least such portion of the dielectric layer.

In some aspects, the portion of the dielectric layer separating adjacent ones of the posts from another may be planarized to form a flat surface of the dielectric layer. In some such aspects, a redistribution structure may be formed on at least a portion of the dielectric layer. In some such aspects, the redistribution layer may be formed to have a predetermined pattern of traces within a redistribution dielectric structure.

DETAILED DESCRIPTION

Components described herein such as interposers, substrates, circuit panels, microelectronic elements, and the like may have dielectric structure, in some arrangements, at external surfaces thereof. Accordingly, as used in this disclosure, a statement that an electrically conductive element is "at" a surface of dielectric structure of a component, indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a component may project from such surface; may be flush with such surface; or may be recessed relative to such surface in a hole or depression in the component.

Figure 1:
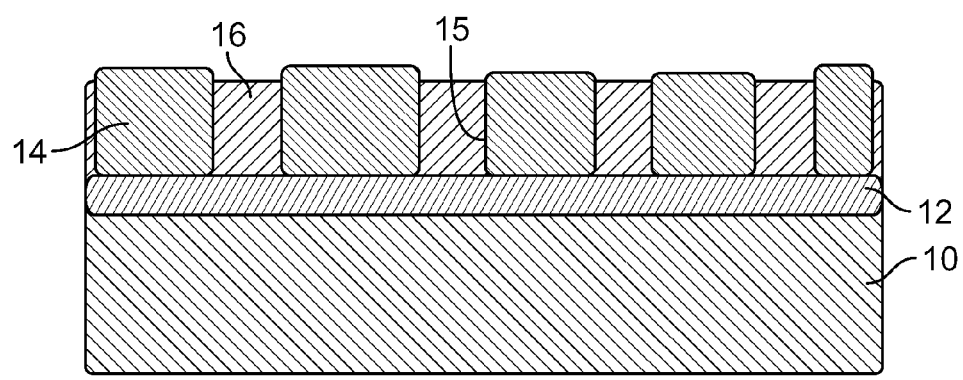
FIG. 1 is a cross-sectional elevation view illustrating a step of a fabrication process of a mold in accordance with an embodiment.

Turning now to the figures, where similar numeric references are used to indicate similar features, there is shown in FIG. 1 a mold 5 in accordance with an embodiment. As in this example, the mold 5 may be formed by applying a seed coating 12 along a surface of a substrate 10. In some arrangements, the substrate 10 may be a silicon wafer, a glass sheet, a glass ceramic sheet, or other known dielectric materials, and the like. A mold dielectric layer 14, which may be a photo resist layer, may be placed onto a surface of the seed coating 12 at various positions in a desired pattern to define blind holes 15 within the mold dielectric layer 14. In some arrangements, the mold dielectric layer 14 may be patterned by etching, ablation, or other known processes. In the example shown, the seed coating 12 may be conductive such that the blind holes 15 may be filled with a conductive mold plating 16, such as by an electrolytic plating process known to those of ordinary skill in the art. The mold plating 16 may be made but is not limited to being made of nickel and nickel alloys, such as nickel tungsten and alloys thereof.

Figure 2:
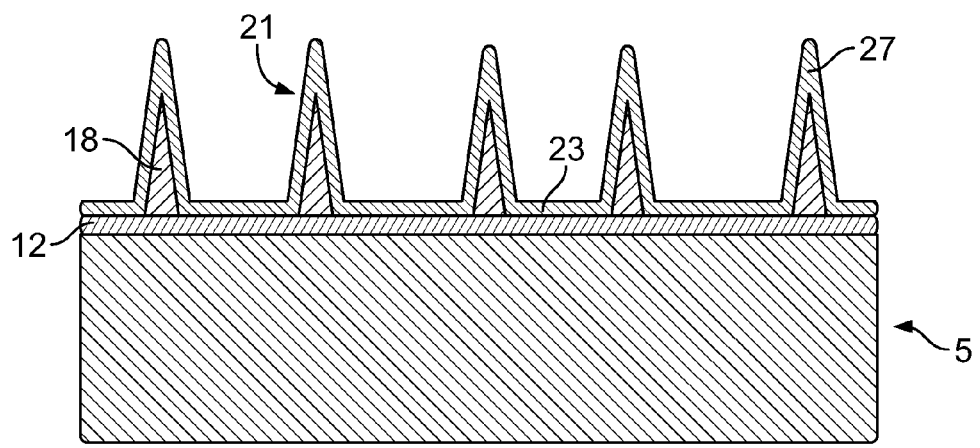
FIG. 2 is a cross-sectional elevation view illustrating an additional step of the fabrication process of the mold being fabricated in FIG. 1.

Referring to FIGS. 1 and 2, the mold dielectric layer 14 may then be removed and the mold plating 16 may be cleaned, leaving mold extensions 18 and exposed regions of the mold seed coating 12. When an electrolytic plating process is used, the mold seed coating 12 may form a strong bond with the mold extensions 18 such that the mold 5 may be used as a master mold to form a plurality of replicates which in turn may be used for forming vias of an interposer, as described further herein. In some arrangements, the mold dielectric layer 14 may be given a slight taper so as to form the mold extensions 18 with a cone-like shape, or other desired shapes. Such shapes generally may be convex relative to the mold dielectric layer 14 to allow for easier removal of the mold dielectric layer 14 from the mold coating 12. In some arrangements, the mold extensions 18 of the mold 5 may be electro-polished which may be used to clean or further clean the mold extensions 18 and which may be used to shape or further shape the mold extensions 18, such as to provide a smooth taper, as shown in FIG. 2. The extensions 18 preferably may have a taper less than 5 degrees, and more preferably in the range between 1 and 2 degrees, from vertical within planes extending radially from longitudinal axes through each of the respective extensions.

As further shown in FIG. 2, in accordance with another embodiment, a replicate 21 may be formed over the mold extensions 18 and the exposed regions of the mold seed coating 12. As shown, the replicate 21 may include a replicate base 23 that may conform to the exposed regions of the mold seed coating 12. The replicate 21 may also include replicate extensions 27 that may conform to the mold extensions 18. The replicate 21 may be a conformal coating of mold or sheet blow forming which may be made of materials such as but not limited to polyimide, parylene, glass, silicon glass polymer, mold compounds, B-stage materials, and the like.

Figure 3:
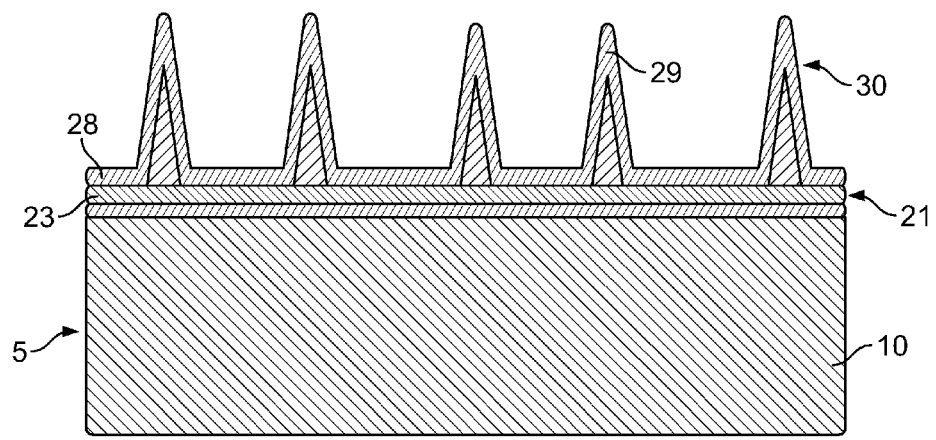
FIG. 3 is a cross-sectional elevation view illustrating a step of a fabrication process of an interposer using the mold being fabricated in FIG. 1 in accordance with an embodiment.
Figure 4:
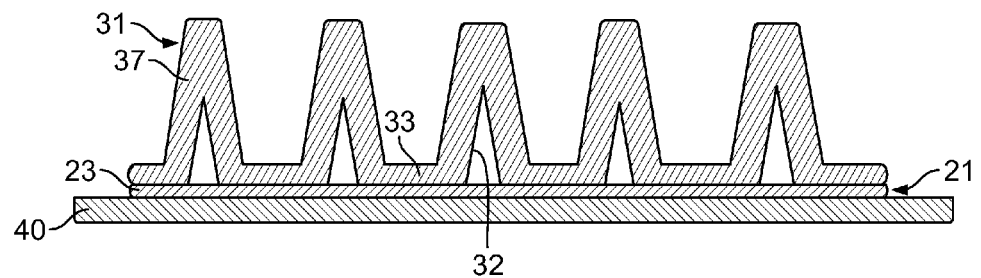
FIG. 4 is a cross-sectional elevation view illustrating a step of a fabrication process of an interposer in accordance with an embodiment.

Referring now to the arrangements in the examples of FIGS. 3 and 4, a replicate seed coating 28 may be applied over the replicate 21, such that it may conform to the shape of and may fully cover the replicate 21. In conforming to the shape of the replicate 21, the replicate seed coating 28 may include a seed coating base 29 and a seed coating post 30 extending therefrom. The replicate seed coating 28, which may be made but is not limited to being made of copper, copper alloys, nickel, nickel alloys, gold, gold alloys, aluminum, aluminum alloys, and the like, may be formed by electroless plating or other known methods of applying a conductive material to a dielectric material, e.g., by sputtering. The replicate seed coating 28 preferably may have a thickness in the range between 100 and 2000 angstroms, and more preferably in the range between 100 and 500 angstroms.

A conductive layer 31 may then be applied to the replicate seed coating 28, such that it may conform to the shape of and may coat, and preferably fully coat, the replicate seed coating 28. In conforming to the shape of the replicate seed coating 28, the conductive layer 31 may include a conductive base 33 and a conductive post 37 extending therefrom. The conductive layer 31, which may be made but is not limited to being made of copper, nickel, gold, aluminum, alloys of any of copper, nickel, gold, and aluminum, or a combination of any of these materials may be formed by electrolytic plating of multiple layers of conductive material to form the conductive layer 31. In particular, the electrolytic plating may be performed at a rate preferably in the range between 0.5 µm/min and 20 µm/min, and more preferably in the range between 1 µm/min and 10 µm/min. The plating process may be repeated until the conductive layer 31 preferably may have a thickness in the range between 2 µm and 800 µm, and more preferably may have a thickness in the range between 5 µm and 100 µm. In some arrangements, when a combination of materials are used for the conductive layer as described above, one material may be used for the first layer or set of layers to act as a barrier layer and then another material or other materials may be used for additional layers.

In some arrangements, prior to applying the replicate seed coating 28, a surface activation (not shown), acting as one or both of a barrier and an adhesion layer, may be applied to the replicate 21 such that it may conform to the shape of and may fully coat the replicate 21. In this manner, the combination of the replicate seed coating 28 and the conductive layer 31 may be removed from the replicate 21. The surface activation layer may be a thin layer and may be made but is not limited to being made of nickel alloys, such as nickel tungsten, nickel phosphorous, or nickel boron; cobalt alloys such as cobalt phosphorous, tungsten phosphorous; or any combination of these materials. The surface activation layer may be applied by an electroless plating process. Such a layer preferably may have a thickness in a range between 50 and 1000 angstroms.

In an alternative arrangement as illustrated in FIG. 4, the replicate 21 may be removed from the mold 5. In some such arrangements, a mold release agent (not shown) may be applied to the mold extensions 18 of the mold 5 prior to the formation of the replicate 21 to allow for cleaner and easier separation of the replicate 21 from the mold 5. In some other such arrangements, the materials may be incorporated into the mold 5 to aid in releasing the mold from the replicate. Such mold release materials may be but are not limited to being nickel, polytetrafluoroethylene (PTFE), and combinations of these materials. After removal from the mold 5, the replicate 21 may then be attached, such as by a photodegradable adhesive, to a support layer 40, which may be made of transparent materials such as glass. The conductive layer 31 may then be applied to the replicate 21, as described with respect to FIG. 3. In some alternative arrangements, a second replicate seed coating may be applied to one or more voids 32 defined by the undersides of corresponding ones of the replicate extensions 27. The seed coating may conform to the shape of the voids 32, identified in FIG. 4. In such arrangements, a second conductive layer may be deposited onto the second replicate seed coating. The second conductive layer may conform to the shape of the voids 32 and the second replicate seed coating. Either of the first and the second conductive layers may be formed first. In an example of forming the second conductive layer, the replicate may be placed onto and may be attached to a second support layer, or in some arrangements the support layer 40, with the replicate extensions placed against such a support layer. In such an example, the replicate may remain a part of the final assembly, such as an interposer or microelectronic assembly.

Figure 5:
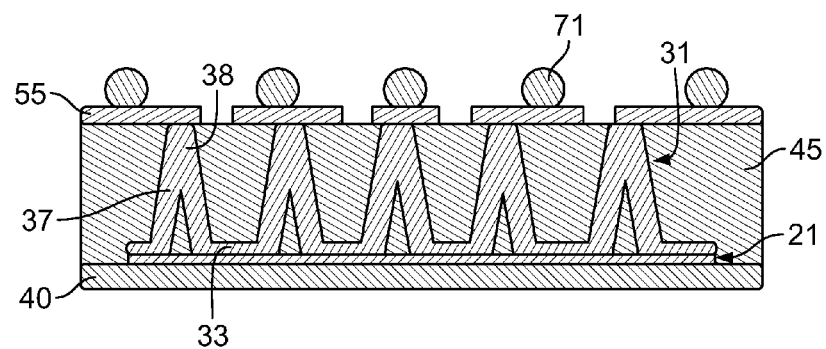
FIG. 5 is a cross-sectional elevation view illustrating an additional step of a fabrication process of an interposer being fabricated in FIG. 4 in accordance with an embodiment.
Figure 6:
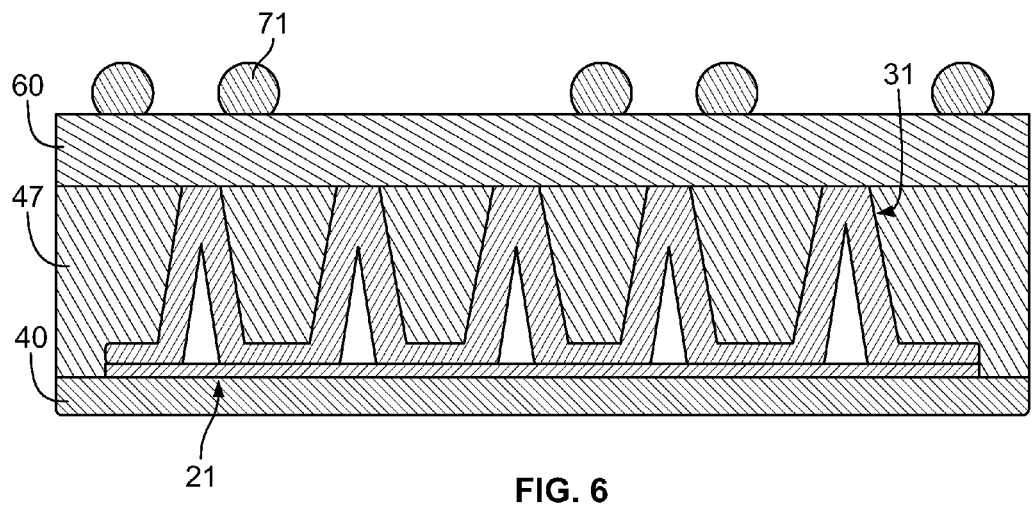
FIG. 6 is a cross-sectional elevation view illustrating a step of a fabrication process of an interposer in accordance with an embodiment.

Referring now to FIGS. 5 and 6, in an embodiment, a dielectric layer may be applied to the conductive layer 31 in forming in-process structures, which may be used for forming an interposer, as discussed further herein. As shown in these respective examples, the conductive layer 31 may have been applied to a replicate 21 which may be attached to a support layer 40. As shown, the respective dielectric layers 45, 47 may be applied such that it may conform to the shape of and may fully coat the conductive layer 31. The dielectric layers 45, 47 may be made of but is not limited to being made of a resist coating, a mold material, lamination, or the like. In particular, the example of FIG. 5 shows the dielectric layer as a permanent resist coating interposed between the conductive posts 37 and covering the conductive base 33 of the conductive layer 31. The example of FIG. 6 shows the dielectric layer 47 as a mold matrix which may have a coefficient of thermal expansion similar to a metal of the conductive layer 31 to reduce the potential for separation of the dielectric layer 47 from the conductive layer 31.

In some arrangements, an adhesion layer may be placed over the conductive layer 31 prior to depositing the dielectric layer 45, 47 onto the conductive layer 31 to aid in bonding of the dielectric layer 45, 47 to the conductive layer 31. Such an adhesion layer may be made but is not limited to being made of silicon nitride, or a nickel alloy, such as but not limited to nickel tungsten, in which such metals may be deposited through electrolytic or electroless plating processes.

As further shown in FIGS. 5 and 6, at least a portion of the dielectric layer 45, 47 may be planarized to form a flat surface of the dielectric layer 45, 47 opposite a surface of the dielectric layer 45, 47 contacting the conductive base 33 of the conductive layer 31. Planarizing of the dielectric layer 45, 47 may be performed by but is not limited to milling which may be through the use of an end mill, chemical mechanical planarization (CMP), resist etching-back (REB), laser ablation, and the like. As shown in each of FIGS. 5 and 6, the dielectric layer 45, 47 preferably may be planarized to a depth at which the post ends 38 of the conductive layer 31 are first exposed. In some alternative arrangements, the dielectric layer 45, 47 may be planarized to a depth such that a hole is formed through at least one of the post ends 38 of a corresponding conductive post 37. In such arrangements, any such holes through the one or more post ends 38 and corresponding voids defined by undersides of any of the conductive posts 37 having such holes may be filled with a metallic or polymeric material to provide one or both of rigidity and stiffness to the filled conductive posts.

As illustrated in FIG. 5, in some arrangements, a conductive coating 55 may be applied at at least some of the exposed post ends 38 of the conductive layer 31 such that the conductive coating 55 may be physically connected to the conductive layer 31. The conductive coating 55 may be made of conductive materials such as but not limited to copper, copper alloys, nickel, nickel alloys, and combinations of either of copper or copper alloys with titanium tungsten alloys. In this manner, the conductive coating 55 may be electrically connected to the conductive layer 31. As further shown in FIG. 5, the conductive coating 55 may include a series of segments that are connected to respective post ends 38 of the conductive layer 31. The segments of the conductive coating 55 may extend a distance away from the post ends 38, which may act as contacts, in a direction parallel to the planarized surface of the dielectric layer 45 such that the conductive coating 55 acts to provide traces to allow for connections remote from the post ends 38. Such a configuration is described in copending U.S. patent application Ser. No. 13/795,756 ("the '756 Application"), the entire disclosure of which is hereby incorporated by reference herein. Joining elements 71, which may be solder balls, may be applied to the segments of the conductive coating 55 to provide connections to components such as interposers, substrates, circuit panels, microelectronic elements, and the like, as described further herein, and as described more fully in the '756 Application.

In some arrangements, the conductive coating 55 may be applied at least at a portion of the planarized surface of the dielectric layer 45. In some such arrangements, the conductive coating 55 may be applied as a layer over both of the exposed post ends 38 of the conductive layer 31 and the dielectric layer 45. In some arrangements, portions of the conductive coating 55, in particular selected portions between the post ends 38 as shown, may then be removed, such as by but not limited to etching, to electrically isolate the selected post ends 38 of adjacent conductive posts 37 from each other. In some arrangements, unwanted dielectric material 45 also may be removed during the removal of portions of the conductive coating 55.

As shown in FIG. 6, in an embodiment, a first redistribution structure 60 may be formed at the surface defined by the planarized dielectric layer 47 and the exposed post ends 38 of the conductive layer 31. The redistribution structure 60 may be in a configuration similar to that described in the '756 Application. In this manner, the redistribution structure 60 may include one or more redistribution dielectric layers and traces therein (not shown) extending in a direction parallel to the planarized dielectric layer 47 in which the traces may be internally electrically connected by vias extending through the one or more redistribution dielectric layers. As shown, the first redistribution layer 60 may electrically interconnect at least some of the exposed post ends 38 to the joining elements 71 to provide the connections described above with respect to the conductive coating 55 and as described further herein and more fully in the '756 Application.

Figure 7:
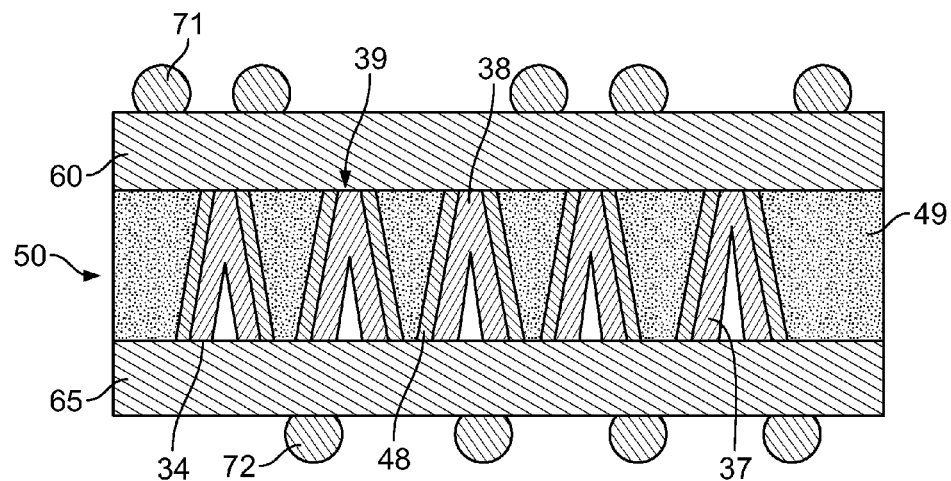
FIG. 7 is a cross-sectional elevation view illustrating an interposer fabricated in accordance with an embodiment.

Referring now to FIG. 7, in accordance with an embodiment, an interposer 50 may include each of the features of the example shown in FIG. 6 with certain exceptions as well as additional process steps applied thereto as noted further herein. In particular, in the example of FIG. 7, a dielectric coating 48, which may be a conformal coating, may be applied to a conductive layer, such as the conductive layer 31 shown in FIGS. 5 and 6. The dielectric coating 48 may be made but is not limited to being made of silicon carbide, silicon nitride, polyimide. The dielectric coating 48 preferably may have a thickness in the range between 0.1 and 2 μm, and more preferably in the range 0.2 μm and 1 μm. Although not shown, the dielectric coating 48 preferably may be applied while the conductive layer is covering a prefabricated structure such as but not limited to a replicate, such as the replicate 21, which may be attached to a support layer, such as the support layer 40, (See FIG. 4), a mold, such as the mold 5, and the like. In some arrangements, the dielectric coating 48 may be applied such that it may conform to the shape of and may fully coat the underlying conductive layer. In alternative arrangements, the dielectric coating 48 may only be applied onto the conductive posts 47 such that the conductive posts 37 are exposed following deposition of the dielectric coating 48. In this manner, as further shown in FIG. 7, a conducting matrix 49 may be applied onto the dielectric coating 48. The conducting matrix 49 may be made of a polyimide mold matrix. In some arrangements, the conducting matrix 49 may contain heat conductive particles or particulates of flakes. In some such arrangements, the particles or flakes, may be made but are not limited to being made of carbon or other polymer having good heat conducting or dispersing properties, aluminum, or other metallic particles or flakes having good heat conducting or dispersing properties. The conducting matrix 49 preferably may have a thickness in the range between 10 and 500 μm, and more preferably in the range between 10 and 200 μm. Through the use of the dielectric coating 48, such a structure provides good heat conductivity while preventing electrically conductivity between the conducting matrix 49 and a conductive layer.

Figure 9:
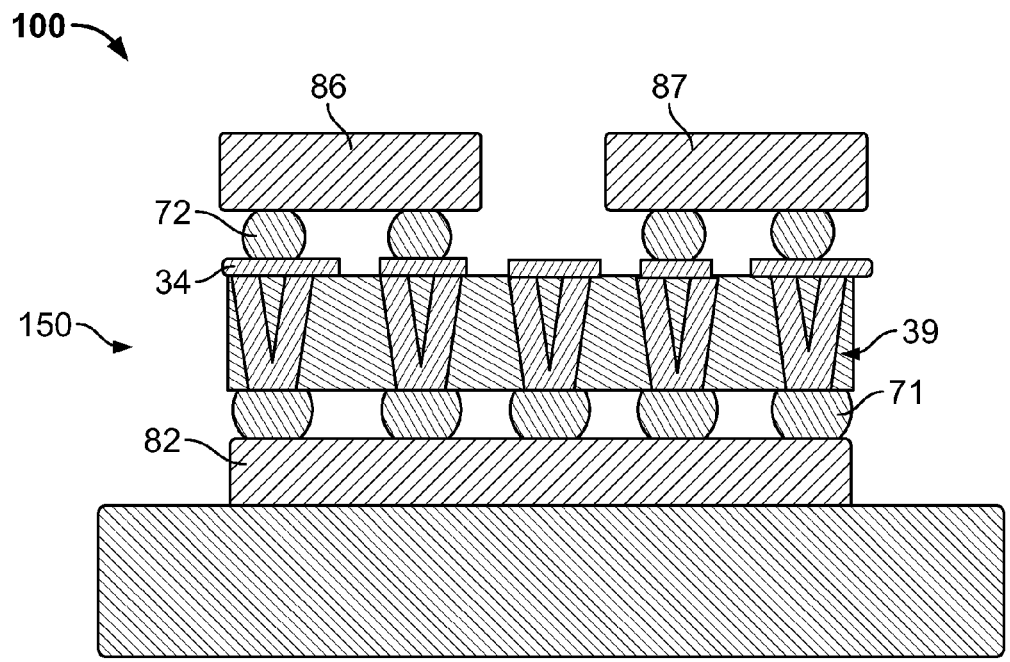
FIG. 9 is a cross-sectional elevation view illustrating an additional step of the fabrication process of the microelectronic assembly being fabricated in FIG. 9.

In some arrangements in which a conformal coating is applied, the combination of the separated conductive layer and the conformal coating 48 may be removed from the prefabricated structure. In some such arrangements, the conductive layer 31 then may be severed between the conductive posts 37, such as but not limited by etching through the conductive base, such as the conductive base 33 (See FIG. 5 for example) in a patterning step to form conductive base ends 34 and to isolate the conductive posts 37, forming vias 39 as shown in FIG. 7 and as best shown in FIG. 9 discussed further herein. In this manner, an interposer 50 in accordance with an embodiment may be provided, in which the interposer has oppositely-facing major surfaces. In some such arrangements, the first redistribution structure 60 may overlie one of the major surfaces, and a second redistribution structure 65 may overlie the other of the major surfaces, as further described more fully in the '756 Application. As further shown in FIG. 7, the joining elements 71 may be deposited onto the first redistribution layer 60 at predetermined positions for interconnection with other components, such the components described previously herein. Furthermore, joining elements 72, which may be solder balls, may be deposited onto the second redistribution layer 65 at predetermined positions for interconnection with still other components, as described in further examples herein and more fully in the '756 Application. Accordingly, through the interposer 50, components interconnected to the first redistribution layer 60 may be electrically interconnected to the components interconnected to the second redistribution layer 65.

Figure 8:
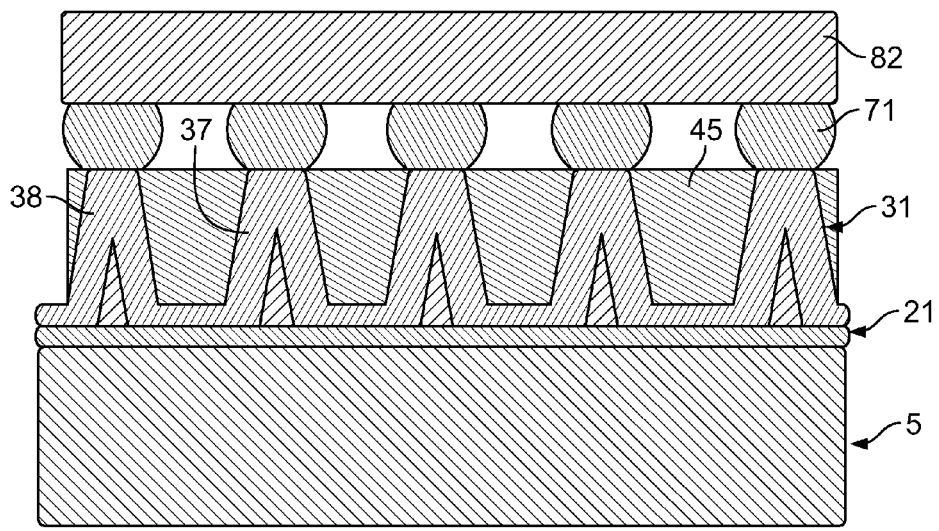
FIG. 8 is a cross-sectional elevation view illustrating a step of a fabrication process of a microelectronic assembly fabricated by the step of a fabrication process of an interposer being fabricated in FIG. 4 in accordance with an embodiment.

As shown in FIG. 8, in forming an interposer in accordance with an embodiment, a microelement 82 may be physically and electrically connected to a plurality of joining elements 71. As shown in this example, the joining elements 71 may be joined to at least some of the exposed post ends 38 formed through the process described previously herein in relation to FIGS. 3 and 4. Although FIG. 8 shows the microelectronic element 82 being connected to the joining elements 71 while the conductive layer 31 overlies the replicate 21 in which the replicate 21 overlies the mold 5, such a connection may be made while the conductive layer 31 overlies any rigid support, such as a the replicate 21 overlying the support layer 40, as described in the example of FIG. 4.

FIG. 9 illustrates further processing of the structure shown in FIG. 8. To form this configuration, the conductive layer 31 may be removed from the replicate 21. The assembly of the conductive layer 31, the joining elements 71, and the microelectronic element 82 may be flipped and the microelectronic element 82 may be attached to a support element 140 to provide rigidity during further processing. The conductive base 33 of a conductive layer may then be patterned, such as by but not limited to etching, to form the vias 39 and an interposer 150. Joining elements 72 may then be deposited onto at least some of the base ends 34 to which second and third microelectronic elements 86, 87 may be attached and electrically interconnected to form a microelectronic assembly 100. In this manner, the first microelectronic element 82 may be electrically interconnected to both of the second and third microelectronic elements.

Figure 10:
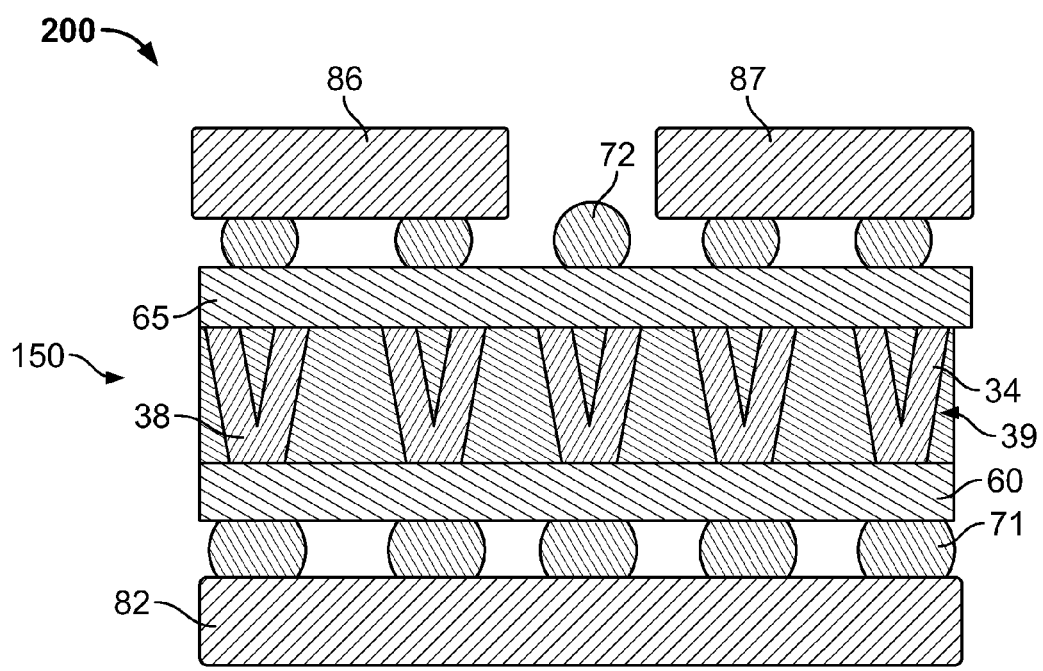
FIG. 10 is a cross-sectional elevation view of illustrating a step of a fabrication process of a microelectronic assembly fabricated by the step of a fabrication process of an interposer being fabricated in FIG. 4 in accordance with an embodiment.

In an alternative arrangement, as shown in FIG. 10, in some arrangements, prior to depositing the joining elements 71 at the exposed post ends 38, the redistribution layer 60 may be formed to overlie a major surface of the interposer 150 and the exposed post ends 38. As further shown, in some arrangements, prior to depositing the joining elements 72 at the base ends 34, the redistribution layer 65 may be formed to overlie a major surface of the interposer 150 and the base ends 34. The microelectronic elements 82, 86, and 87 may then be attached to the respective joining elements 71, 72 as described with respect to FIG. 9 above. In this manner, the first microelectronic element 82 may be electrically interconnected to both of the second and third microelectronic elements in which contacts of each of the microelectronic elements may be laterally offset from the contacts of the interposer located at the post ends 38 and the base ends 34, as further described more fully in the '756 Application.

It is to be understood that the disclosure set forth herein includes all possible combinations of the particular features set forth above, whether specifically disclosed herein or not. For example, where a particular feature is disclosed in the context of a particular aspect, arrangement, configuration, or embodiment, or a particular claim, that feature can also be used, to the extent possible, in combination with and/or in the context of other particular aspects, arrangements, configurations, and embodiments of the invention, and in the invention generally.

Furthermore, although the invention herein has been described with reference to particular features, it is to be understood that these features are merely illustrative of the principles and applications of the present invention. It is therefore to be understood that numerous modifications, including changes in the sizes of the various features described herein, may be made to the illustrative embodiments and that other arrangements may be devised without departing from the spirit and scope of the present invention. In this regard, the present invention encompasses numerous additional features in addition to those specific features set forth in the claims below. Moreover, the foregoing disclosure should be taken by way of illustration rather than by way of limitation as the present invention is defined by the claims set forth below.

The invention claimed is:

1. A method for making an interposer comprising:
   forming a conductive layer contacting a replicate such that a shape of a surface of the conductive layer conforms to a shape of the contacted portion of the replicate, the conductive layer having a base and a plurality of conductive posts projecting away from the base, each conductive post having a post end opposite the base;
   attaching a support layer to the replicate to provide support to the replicate during at least one processing step;
   forming a dielectric layer covering the base and separating adjacent ones of the posts from each other; and
   removing a portion of the conductive layer to insulate at least one post from at least one other post, a remaining portion of the conductive layer forming at least one via;
   forming a second conductive layer contacting the replicate such that a shape of a surface of the second conductive layer conforms to a shape of the contacted portion of the replicate, the second conductive layer having a second base and a plurality of second conductive posts projecting away from the second base, each second conductive post having a second post end opposite the second base, the second conductive layer contacting the replicate on a side of the replicate opposite the conductive layer;
   removing the replicate from the support layer;
   forming a first conductive coating over at least a portion of the conductive posts of the conductive layer; and
   forming a second conductive coating onto the base of the conductive layer,
   wherein the first and second conductive coatings are electrically connected through the conductive layer.

2. The method of claim 1, wherein forming the conductive layer includes electroless plating of a seed coating onto the replicate.

3. The method of claim 1, further comprising forming one or both of a barrier layer and an electroless adhesion layer onto the replicate prior to forming the conductive layer.

4. The method of claim 1, wherein forming the conductive layer comprises:
   forming a seed coating onto the replicate; and
   electrolytic plating of a conductive material onto the seed coating.

5. The method of claim 1, wherein the dielectric layer is one of a permanent resist coating, a mold, lamination, and a conformal coating.

6. The method of claim 5, wherein the dielectric layer is a conformal coating and a heat conducting layer is formed on the conformal coating.

7. The method of claim 1, further comprising planarizing at least some of the portion of the dielectric layer covering the conductive layer to form a flat surface of the dielectric layer prior to forming the first conductive coating.

8. The method of claim 7, wherein planarizing is performed by milling.

9. The method of claim 1, wherein the dielectric layer is formed to cover at least some of the plurality of conductive posts of the conductive layer, the method further comprising thinning portions of the dielectric layer to remove unwanted materials and to expose the post ends of the at least some conductive posts.

10. The method of claim 1, further comprising
    removing a portion of the conductive posts to expose a void within the conductive posts; and
    filling the void to provide rigidity to the conductive post.

11. The method of claim 1, further comprising electrically coupling a first microelectronic element to a second microelectronic element through at least one of the conductive posts.

12. The method of claim 1, wherein forming the first and second conductive coatings comprises forming first and second redistribution structures, respectively, at oppositely-facing surfaces of the dielectric layer, the first and second redistribution structures having respective patterns of traces and redistribution dielectric layers, the traces of the first and second redistribution layers being electrically coupled through the conductive layer.

13. The method of claim 1, further comprising the steps of:
    forming at least one first joining element on the post ends of at least a respective one of the conductive posts, wherein the at one first joining element and the respective at least one of the conductive posts are electrically connected;
    attaching a first surface of at least a first microelectronic element to the at least one first joining element, the first microelectronic element being electrically connected to the at least one first joining element; and
    attaching a second surface of the at least first microelectronic element to a support element.

14. The method of claim 13, further comprising removing the replicate from the mold, wherein the second surface of the at least first microelectronic element remains attached to the support element after removing the replicate from the mold.

15. The method of claim 1 further comprising, prior to forming the conductive layer,
    forming a seed coating onto a substrate;
    forming a mold dielectric layer onto the seed coating, the mold dielectric layer including a plurality of holes therethrough;
    forming the plurality of extensions within respective ones of the plurality of holes of the mold dielectric layer;
    removing the mold dielectric layer from the seed coating to form a mold, the mold including the extensions; and
    forming the replicate on the extensions of the mold.

16. A method for making an interposer comprising the steps of:
    forming a conductive layer contacting a replicate such that a shape of a surface of the conductive layer conforms to a shape of the contacted portion of the replicate, the conductive layer having a base and a plurality of conductive posts projecting away from the base, each conductive post having a post end opposite the base;
    forming a dielectric layer covering the base and separating adjacent ones of the posts from each other; and
    removing a portion of the conductive layer to insulate at least one post from at least one other post, a remaining portion of the conductive layer forming at least one via;
    forming a seed coating onto a substrate;
    forming a mold dielectric layer onto the seed coating, the mold dielectric layer including a plurality of holes therethrough;
    forming a plurality of extensions within respective ones of the plurality of holes of the mold dielectric layer;
    removing the mold dielectric layer from the seed coating to form a mold, the mold including the extensions; and
    forming the replicate on the extensions of the mold;
    wherein the extensions are conductive, the conductive extensions being at least electrically connected to the seed coating during formation of the conductive extensions.

17. The method of claim 16, further comprising the step of electropolishing the extensions to form a tapered side surface thereon.

18. The method of claim 16, wherein after performing the step of electropolishing, the side surfaces of the extensions have a taper less than 5 degrees from vertical within planes extending radially from longitudinal axes through each of the respective extensions.

19. The method of claim 16, wherein the replicate conforms to the mold such that the replicate has replicate extensions extending from a replicate base thereof.

20. The method of claim 16, further comprising the step of removing the replicate from the mold.

* * * * *